United States Patent
Takemori et al.

(10) Patent No.: US 6,899,936 B2
(45) Date of Patent: May 31, 2005

(54) STAMPER, MANUFACTURING METHOD THEREFOR AND OPTICAL DEVICE MANUFACTURED THEREWITH

(75) Inventors: Hirotoshi Takemori, Nara (JP); Kazunori Matsubara, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/233,298

(22) Filed: Aug. 30, 2002

(65) Prior Publication Data

US 2003/0138589 A1 Jul. 24, 2003

(30) Foreign Application Priority Data

Aug. 30, 2001 (JP) ........................................ 2001-261691

(51) Int. Cl.[7] .............................................. B32B 3/02
(52) U.S. Cl. ................ 428/64.1; 428/64.4; 430/270.11; 216/41
(58) Field of Search .............................. 428/64.1, 64.4, 428/913; 430/270.11, 495.1, 945; 216/24, 41, 58, 74

(56) References Cited

U.S. PATENT DOCUMENTS

| | | | | |
|---|---|---|---|---|
| 4,723,903 A | * | 2/1988 | Okazaki et al. ............. | 425/385 |
| 5,347,510 A | * | 9/1994 | Hirokane et al. ......... | 369/275.5 |
| 5,863,702 A | * | 1/1999 | Ohbayashi et al. .... | 430/270.13 |
| 6,071,588 A | * | 6/2000 | Nobumasa et al. ......... | 428/64.4 |
| 6,228,562 B1 | * | 5/2001 | Kawanishi ................... | 430/321 |
| 6,287,660 B1 | * | 9/2001 | Hosaka et al. ............. | 428/64.1 |
| 6,288,998 B1 | * | 9/2001 | Taira ....................... | 369/275.4 |
| 2002/0154595 A1 | * | 10/2002 | Takagishi et al. ........... | 369/277 |

FOREIGN PATENT DOCUMENTS

| | | |
|---|---|---|
| JP | 5-198016 | 8/1993 |
| JP | 10-010307 | 1/1998 |
| JP | 10-068807 | 3/1998 |
| JP | 11-333884 | 12/1999 |
| JP | 2000-231011 | 8/2000 |
| JP | 2000-246810 | 9/2000 |

* cited by examiner

*Primary Examiner*—Elizabeth Mulvaney
(74) *Attorney, Agent, or Firm*—David G. Conlin; Steven M. Jensen; Edwards & Angell, LLP

(57) ABSTRACT

A fine pattern of an optical device formed by the Photo-Polymer method has a groove 100, a side wall 100a of which is sloped against a surface of stamper 18. The slope angle θ of the side wall 100a satisfies the following relational expression: $\mathrm{Tan}^{-1}(4 \times h \times w_1^{-0.2}) < \theta < 80°$ where h: a depth of the groove 100; and $w_1$: a width of a top of a projected portion formed by the side walls 100a. Burrs formed in the optical device are reduced, and thereby mass productivity of the optical device is improved.

16 Claims, 12 Drawing Sheets

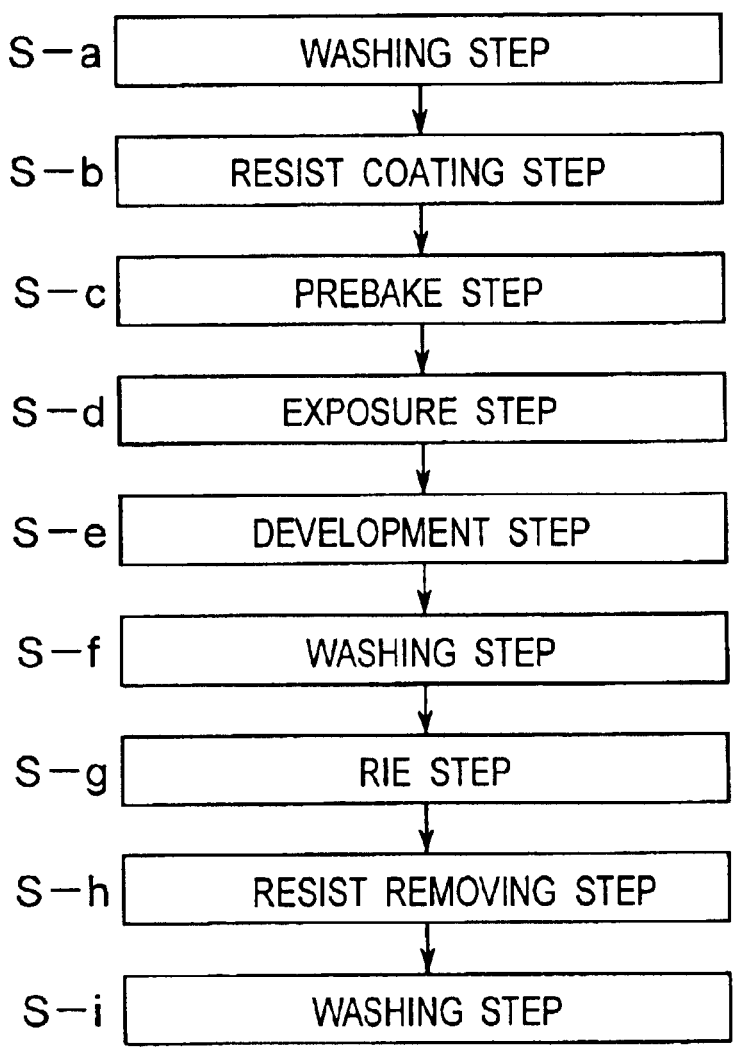

STAMPER, MANUFACTURING METHOD THEREFOR AND OPTICAL DEVICE MANUFACTURED THEREWITH

BACKGROUND OF THE INVENTION

The present invention relates to a stamper which is used to manufacture an optical device for use in a pickup component for an optical disc such as CD (Compact Disc), CD-ROM (Compact Disc Read Only Memory), MD (Mini Disc), LD (Laser Disc) and so forth. The present invention also relates to a manufacturing method for the stamper and an optical device manufactured therewith.

In general, a hologram device used as a pickup component for an optical disc usually has a size of several square millimeter. In order to manufacture a large number of hologram devices at a low cost, a plurality of hologram devices are formed in a batch on a large light-transmitting substrate and separated into individual hologram devices. An extremely fine diffraction grating is precisely formed in the hologram device. Various methods has been employed for forming this diffraction grating, which are for example a manufacturing method of a semiconductor device as shown in FIGS. 9A to 9F, a forming method called the Photo-Polymer method (hereinafter, referred to as the 2P method) as shown in FIGS. 10A to 10C and FIGS. 11A to 11D and so forth.

Hereafter, a manufacturing method of a hologram device is described with reference to FIGS. 9A to 9F, which method utilizes a manufacturing method of a semiconductor device.

First, one surface of a glass substrate 51 is coated with a photosensitive material 52 by a spin coating method or the like as shown in FIGS. 9A and 9B.

Then, a prescribed pattern is formed in the photosensitive material 52 by photolithography as shown in FIG. 9C.

Subsequently, as shown in FIG. 9D, a fine pattern 51a is formed on the glass substrate 51 in an atmosphere of a gas such as $CF_4$, $CHF_3$ or the like by a Reactive Ion Etching (hereafter, referred to as "RIE") method. At this time, the photosensitive material 52 is processed together with the glass substrate 51. Therefore, a relationship of the etch rate for the glass substrate 51 and the etch rate for the photosensitive material 52 is confirmed beforehand, and a coating thickness of the photosensitive material 52 is determined so that the photosensitive material 52 remains on the glass substrate 51 even after the pattern 51a having a prescribed depth is formed on the glass substrate 51.

Furthermore, as shown in FIG. 9E, the photosensitive material 52 remaining on the glass substrate 51 is removed by using a solvent or by ashing it under an oxygen gas atmosphere.

Thus, a plurality of hologram devices formed on the glass substrate 51 are divided into finally required shapes H1 as shown in FIG. 9F to complete intermediate products.

However, with the manufacturing method shown in FIGS. 9A to 9F, a long time is required for the RIE process, so that manufacturing efficiency is not improved. Moreover, a diffraction grating cannot be formed on both surfaces of the glass substrate 51 at the same time. Therefore, as one of methods for efficiently forming a diffraction grating on both surfaces at a low cost, the 2P methods shown in FIGS. 10A to 10C and FIGS. 11A to 11D have been proposed.

In the 2P method for manufacturing a hologram device shown in FIGS. 10A to 10C, an original plate 61, on which a fine pattern 61a is formed beforehand, is first coated with an ultraviolet ray curable liquid resin 62, as shown in FIG. 10A. Thereafter, a light-transmitting substrate 63 is placed on the original plate 61 via this ultraviolet ray curable liquid resin 62.

Subsequently, as shown in FIG. 10B, the ultraviolet ray curable resin 62 is pressed and sufficiently expanded in a space formed between the light-transmitting substrate 63 and the original plate 61 while pressurized if required.

Furthermore, after the resin is cured by irradiation of ultraviolet rays, the light-transmitting substrate 63 and the original plate 61 are separated as shown in FIG. 10C. A material having better adhesion to the light-transmitting substrate 63 after curing than to the original plate 61 is selected as the ultraviolet ray curable liquid resin 62, or else the adhesion to the light-transmitting substrate 63 is improved beforehand by pretreatment. Thereby, a resin layer 162 is formed on the light-transmitting substrate 63, so that the resin layer 162 has a pattern 162a transferred from the fine pattern 61a of the original plate 61.

In order to form the transferred pattern on both surfaces of a light-transmitting substrate 73 at the same time, as shown in FIG. 11A, the transparent substrate 73 having primer layers 74, 74' on both surfaces thereof is firstly positioned between upper and lower original plates 71, 71' via ultraviolet ray curable resins 72, 72'.

Subsequently, as shown in FIG. 11B, the resins 72, 72' are pressurized by the upper and lower original plates 71, 71', and then cured by the irradiation of ultraviolet rays UV, as shown in FIG. 11B. Thereafter, the original plates 71, 71' are separated from the substrate 73.

Next, as shown in FIG. 1C, anti-reflection films 75, 75' are vapor-deposited on the resins 72, 72' which have the patterns 172a, 172'a transferred from the fine pattern 71a, 71'a of the original plate 71 on both surfaces of the substrate 73.

Finally, the substrate is divided into required shapes $H_2$ as shown in FIG. 11D.

In this manufacturing method, fine patterns can be simultaneously formed on both surfaces of the substrate 73 by using the substrate 73 and the original plates 71, 71' sandwiching this substrate which all transmit light. Therefore, a high integration can be realized by imparting a tracking beam generating function to one surface of one hologram device and an optical branch/error signal generating function to the other surface, and also manufacturing efficiency can be improved.

For improvement of the production yield of hologram devices and for reduction of manufacturing costs by the 2P method, it is essential to form an original plate with a favorable fine pattern. This original plate (hereinafter, referred to as "stamper") is formed by the procedures shown in FIGS. 12 and 13. It is noted that S-a, S-b, S-e, S-g and S-h of FIG. 12 correspond to FIGS. 13A, 13B, 13E, 13G and 13H to show the same steps of this manufacturing method, respectively.

In step S-a, a quartz substrate 81 is washed. In step S-b, then, the surface of the quartz substrate 81 is coated with a resist 86. In step S-c, the quartz substrate 81 is prebaked to remove a solvent in the resist film. In step S-d, a mask having a fine pattern is aligned and allowed to adhere to the quartz substrate 81 and then exposed. In step S-e, subsequently, photosensitized resist portions are removed by development to form a pattern 87. In step S-f, the substrate is postbaked. In step S-g, RIE, which is a kind of dry etching, is performed in a prescribed depth by using the pattern 87 as a mask. In step S-h, the resist pattern is removed by ashing with an oxygen gas or using a remover. In step S-i, washing is performed as finishing.

However, it has been revealed that a defect called a molding burr generated when a hologram device is manufactured by the 2P method using a stamper. Specifically, as shown in FIG. 14C, the molding burr generates as a defect of a broken piece 97 when an ultraviolet ray curable resin 92 is parted after injecting the ultraviolet ray curable resin 92 into a rectangular groove of a stamper 91 shown in FIG. 14A and curing the resin 92 as shown in FIG. 14B. The broken piece 97 does not usually remain on the stamper side due to the adhesion, and its greater portion is attached to the molded component 92 side. Therefore, a problem arises that the defect generation rate is increased and thus mass productivity is lowered in the manufacture of a hologram device.

As an example of measures for preventing such molding burr, there is Japanese Patent Laid-Open Publication No. 2000-231011. It discloses that a side wall of a stamper groove having a fine pattern is sloped against the stamper surface so that the slope angle θ against the stamper surface satisfies the following relational expression (10), where the depth of the groove in the fine pattern is h and the bottom width of the groove is w.

$$\mathrm{Tan}^{-1}(2h/w)<\theta<80° \quad (10)$$

In addition to the slope, Japanese Patent Laid-Open Publication No. 2000-231011 also discloses that bottom corners of the groove are rounded, that an edge portion are rounded, and that the edge portions are chamfered.

It is evident that the above-stated shapes can reduce generation of the molding burr. However, it has been found that if the side wall of the groove having the fine pattern, which is transferred to the surface of the ultraviolet ray curable resin, is too steep, optical characteristics such as diffraction efficiency are adversely affected. Therefore, a slope angle of the side wall of the groove should be strictly controlled in manufacturing.

When the side wall of the groove in the fine pattern is too steep, primary diffraction efficiency is deteriorated by 2% or more than usual.

A usual hologram pattern is divided into two or more regions, each of which has a different pitch. It is a requirement for the usual hologram device that primary diffraction efficiency in each region is almost equal, specifically, that the ratio of primary diffraction efficiency between the regions (hereinafter, referred to as "efficiency ratio") is 0.9–1.1.

However, when the side wall of the groove is too steep, there occurs a problem that the efficiency ratio is significantly deteriorated and thereby the primary diffraction efficiencies between the regions cannot be made almost equal.

In order to achieve a shape as described above, Japanese Patent Laid-Open Publication No. 2000-231011 discloses the following methods (I)–(V).

(I) Reactive ion etching is performed at a reduced etch rate over a long time.

(II) A blue plate glass is used as a stamper member which easily generates a slope to the groove side wall.

(III) A wet etching step is performed between a developing step and a reactive ion etching step in a manufacturing process of the stamper.

(IV) A wet etching step is performed between the reactive ion etching step and a resist removing step in a manufacturing process of the stamper.

(V) A wet etching step is performed after the resist removing step in a manufacturing process of the stamper.

However, it was found that the methods (I) to (V) had the following problems in mass production.

In (I), in order to reduce the etch rate, incident electric power is made half or lower compared with the usual case. However, such a low incident electric power allows the etched state to be easily unstable. As a result, there may be cases where uniform etching cannot be achieved in an etching chamber and where the etched state varies at each lot of etching. Thus there easily occurs a problem that stampers cannot be manufactured in consistent quality.

In (II), a blue plate glass is used as a stamper member which easily generates a slope to the groove side wall. However, this member does not transmit ultraviolet rays. Therefore, a stamper using the blue plate glass can be applied to only the case where a pattern is formed on one surface of a substrate. As a result, since the pattern cannot be formed on both surfaces of the substrate, mass productivity of the hologram device is deteriorated.

Each of the manufacturing methods (III)–(V) is a wet etching step to be added to a conventional stamper process. In this wet etching, however, it is difficult to etch the whole stamper uniformly. It is also difficult to perform wet etching of the stamper while controlling a concentration, temperature, reaction product, pH and so forth of an etchant. Thus, there occurs a problem that the etched state of each stamper is not uniform.

SUMMARY OF THE INVENTION

Accordingly, an object of the present invention is to provide a stamper with which slope accuracy of a side wall of a groove in a fine pattern formed by the 2P method can be enhanced and mass productivity of an optical device can be improved.

Another object of the present invention is to provide a method for manufacturing a stamper, with which consistent quality can be obtained, and an optical device formed by the stamper. Further, still another object of the present invention is to provide a method for manufacturing a stamper with excellent mass productivity at a low cost.

In order to achieve the above objects, the present invention provide a stamper having a fine pattern on a surface of the stamper with a side wall of a groove in the fine pattern sloped against the surface, wherein an angle θ of the side wall sloped against the surface satisfies a following relational expression:

$$\mathrm{Tan}^{-1}(4 \times h \times w_1^{-0.2}) < \theta < 80°$$

where h: a depth of the groove; and $w_1$: a width of a top of a projected portion formed by the side wall of the groove and an adjoining side wall.

In the case where an optical device is manufactured by for example the 2P method by using the stamper having the above constitution, in which the slope angle θ satisfies the above relational expression, slope accuracy of the side wall of the groove is enhanced. As a result, deterioration of the primary diffraction efficiency and the efficiency ratio of the optical device can be prevented without adversely affecting optical characteristics of the optical device.

Furthermore, since the slope angle θ satisfies the above relational expression, the generation rate of molding burrs in the optical device is reduced. As a result, mass productivity of the optical device can be improved.

The present invention also provide a stamper having a fine pattern on a surface of the stamper with a side wall of a groove in the fine pattern sloped against the surface, wherein a width $w_2$ of a bottom of a projected portion formed by the side wall of the groove and an adjoining side wall satisfies a following relational expression:

$$0.3 \times h < (w_2 - w_1) < h + 0.05$$

where h: a depth of the groove, and $w_1$: a width of a top of the projected portion.

This invention can be expected to obtain exactly the same operational effects as the previously-stated invention.

In one embodiment of the present invention, the fine pattern is formed by reactive ion etching.

According to the embodiment, a stamper is stable in quality since the fine pattern is formed by reactive ion etching. Therefore, a stamper having consistent quality can be obtained.

Furthermore, since the fine pattern is formed by reactive ion etching, the fine pattern is formed at a low-cost and excellent in mass productivity.

In one embodiment of the present invention, the fine pattern is formed by first etching and second etching having a selection ratio lower than the selection ratio of the first etching. Here, the selection ratio refers to the ratio of the etch rate for a stamper member to the etch rate for a resist.

According to the embodiment, a groove shape with a prescribed slope angle can be easily formed by adjusting time for the first etching.

In one embodiment of the present invention, the first etching is performed by using mixture of a $CF_4$ or $CHF_3$ reactive ion gas and an oxygen gas; and the second etching is performed by using a single $CF_4$ or $CHF_3$ reactive ion gas.

According to the embodiment, a groove shape with a prescribed slope angle can be easily formed by adjusting time for the first etching.

In one embodiment of the present invention, the fine pattern is formed by first etching using an oxygen gas on a resist and second etching using a $CF_4$ or $CHF_3$ reactive ion gas.

According to the embodiment, a groove shape with a prescribed slope angle can be easily formed by adjusting time for the first etching.

The present invention provides an optical device including a transparent substrate and an ultraviolet ray curable resin layer disposed on both surfaces of the transparent substrate via a primer layer; and having a fine pattern formed on a surface of the ultraviolet ray curable resin layer with a side wall of a groove in the fine pattern sloped against the surface, wherein an angle $\theta'$ of the side wall sloped against the surface satisfies a following relational expression:

$$\text{Tan}^{-1}(4 \times h' \times w_1'^{-0.2}) < \theta' < 80°$$

where h': a depth of the groove; and $w_1'$: a bottom width of the groove.

According to the optical device having the above constitution, since the slope angle $\theta'$ satisfies the above relational expression, the optical characteristics are favorable, and the primary diffraction efficiency and the efficiency ratio are not deteriorated.

The present invention also provides an optical device including a transparent substrate and an ultraviolet ray curable resin layer disposed on both surfaces of the transparent substrate via a primer layer; and having a fine pattern formed on a surface of the ultraviolet ray curable resin layer with a side wall of a groove in the fine pattern sloped against the surface, wherein a width $w_2'$ of a top of a projected portion formed by the side wall of the groove and an adjoining side wall satisfies a following relational expression:

$$0.3 \times h' < (w_2' - w_1') < h' + 0.05$$

where h': a depth of the groove $w_1'$: a bottom width of the groove.

According to the optical device having the above constitution, since the width $w_2'$ of the top portion of the groove satisfies the above relational expression, the optical characteristics are favorable, and the primary diffraction efficiency and the efficiency ratio are not deteriorated.

The present invention furthermore provides a stamper having a fine pattern on a surface of the stamper with a side wall of a groove in the fine pattern sloped against the surface, wherein an angle $\theta$ of the side wall sloped against the surface is in a range of $60° < \theta < 70°$.

According to the invention, accuracy of the side wall of the groove in the fine pattern formed by the 2P method can be further improved since the slope angle $\theta$ is in the range of $60° < \theta < 70°$. As a result, optical characteristics of the optical device are not adversely affected, and deterioration of the primary diffraction efficiency and the efficiency ratio of the optical device can be reliably prevented.

Since the slope angle $\theta$ of the side wall of the groove in the fine pattern is in the range of $60° < \theta < 70°$, the generation rate of molding burrs in the optical device is reduced. As a result, mass productivity of the optical device can be improved.

The present invention also provides an optical device including a transparent substrate and an ultraviolet ray curable resin layer disposed on both surfaces of the transparent substrate via a primer layer; and having a fine pattern formed on a surface of the ultraviolet ray curable resin layer with a side wall of a groove in the fine pattern sloped against the surface, wherein an angle $\theta'$ of the side wall sloped against the surface is in a range of $60° < \theta < 70°$.

According to the optical device having the above constitution, the slope angle $\theta'$ is in the range of $60° < \theta' < 70°$, the optical characteristics are favorable, and the primary diffraction efficiency and the efficiency ratio are not deteriorated.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a flow chart showing a method for manufacturing the stamper according to the first embodiment of the invention;

DETAILED DESCRIPTION OF THE PREFERRED EMBODIMENTS

Hereafter, embodiments of the present invention are described in detail with reference to accompanying drawings.

Figure 1:
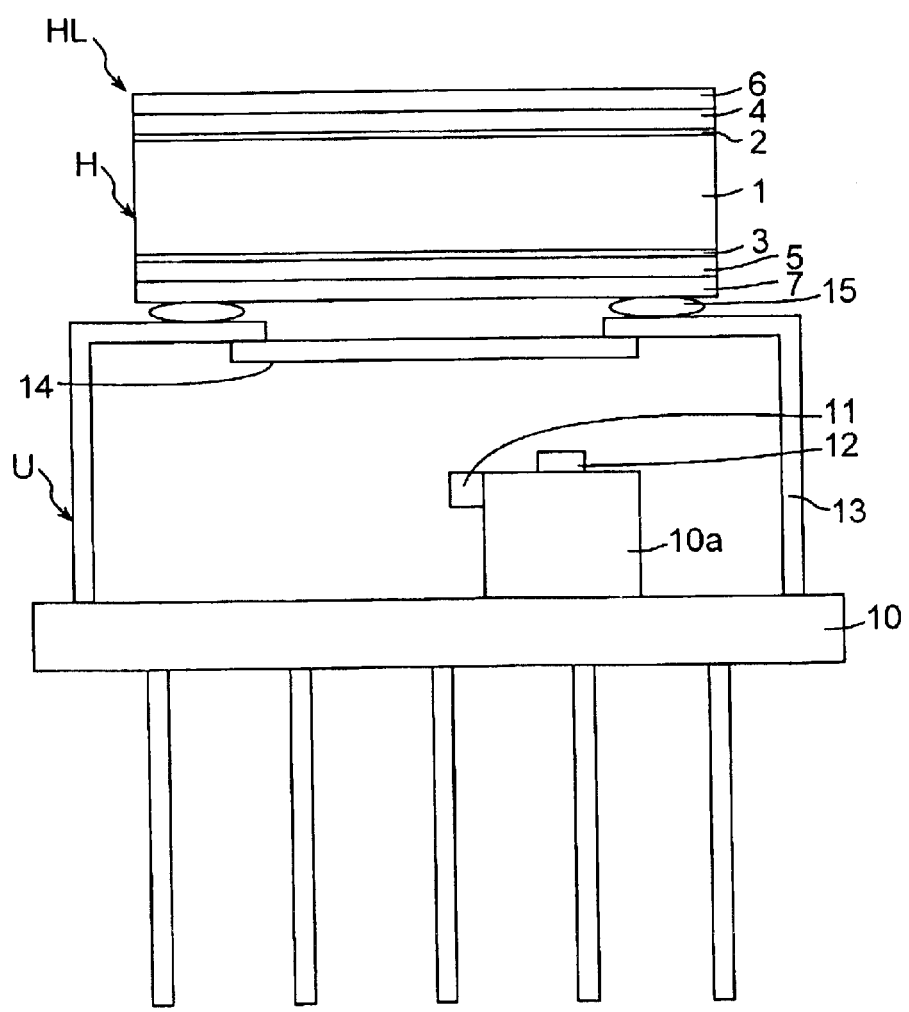
FIG. 1 is a general structural view of a hologram laser unit, wherein a hologram device is attached to a laser unit, the hologram device being an example of an optical device according to the present invention.

FIG. 1 is a general structural view of a hologram laser unit HL, wherein a hologram device H is attached to a laser unit U, the hologram device H being an example of an optical device according to the present invention.

In the laser unit U, a heat sink 10a integrally is formed with a stem 10. A laser chip 11 and a light-receiving device 12 for reading a signal are fixed to the heat sink 10a and covered with a cap 13 having a glass window 14 on top thereof. The lower surface of the hologram device H is fixed on the upper surface of the cap 13 via an adhesive 15.

The hologram device H has a plastic transparent substrate 1, primer layers 2, 3, ultraviolet ray curable resin layers 4, 5 and anti-reflection films 6, 7. On both front and rear surfaces of the plastic transparent substrate 1, there are formed the primer layers 2, 3 for increasing adhesion and the ultraviolet ray curable resin layers 4, 5 having fine patterns. Surfaces of the ultraviolet ray curable resin layers 4, 5 are covered with anti-reflection films 6, 7 having excellent weather resistance.

As the transparent substrate 1, an acrylic extruding/molding material (Brand Name: Sumipex, Grade Name: E011) of Sumitomo Chemical Co., Ltd. is used. As the primer layer 2, 3, an N-vinyl-2-pyrrolidone solvent is used. As the ultraviolet ray curable resin layer 4, 5, MP-107 (viscosity 330 cps in solution) of Mitsubishi Rayon Co., Ltd. is used. As the anti-reflection film 6, 7, a double layer structure of a $ZrO_2+TiO_2$ mixed layer and a $SiO_2$ layer is used.

By 2P (Photo-Polymer) molding method described later, a hologram pattern and a grating pattern, which are fine patterns, are formed on the surfaces of the ultraviolet ray curable resin layers 4, 5 respectively after alignment of each other.

Figure 2:
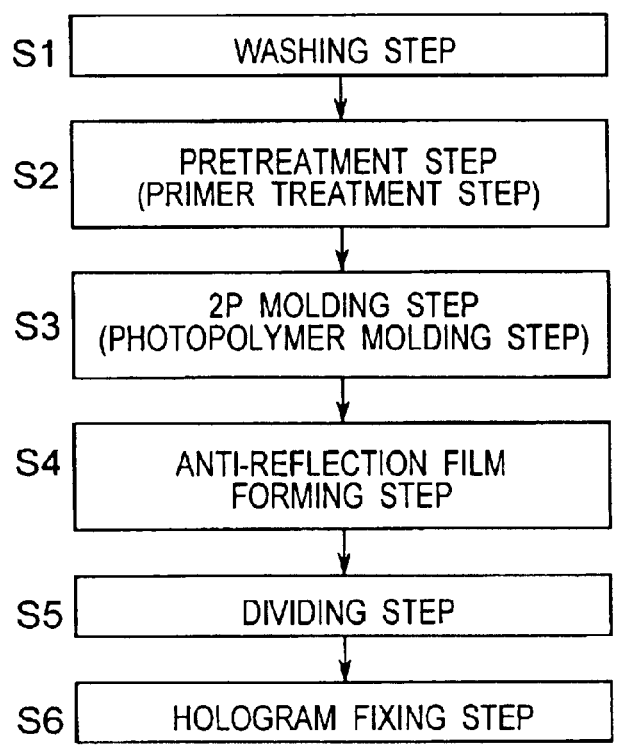
FIG. 2 is a flow chart showing steps of manufacturing the hologram device and a step of fixing the hologram device to the laser unit.

FIG. 2 is a flow chart showing steps of manufacturing the hologram device H and a step of fixing the hologram device H to the laser unit U.

In a washing step S1, for example, 10 sheets of 130 mm×130 mm×2 mm transparent substrates 1 are mounted in a cassette, the whole cassette is dipped in pure water and subjected to ultrasonic cleaning for 2 minutes. Then, the cassette is dipped in IPA (IsoPropyl Alcohol) and subjected to ultrasonic cleaning for 2 minutes, and thereafter the transparent substrates 1 are spontaneously dried.

In a pretreatment step S2, 10 transparent substrates 1 mounted in a cassette are dipped in the N-vinyl-2-pyrrolidone solvent. Then, an excess solvent is removed by using a spin drier such as Rinser/Drier MODEL1600-3 made by Burrtech Co., Ltd., and the substrates are dried in a clean bake furnace at 85° C. for 10 minutes to form the primer layers 2, 3.

Considering inflammability, an explosion-proof measure is taken by using a shielding member of Teflon (registered trademark) material, which has resistance to the solvent, for the spin drier.

In a 2P molding step S3, a 2P molding is performed by using a 2P molding machine described later in order to form a fine pattern on the surface of the ultraviolet ray curable resin layer 4, 5 on the primer layer 2, 3.

Subsequently, in an anti-reflection film step S4, anti-reflection film is performed. In this step, a vapor deposition apparatus such as BMC-850DCI made by Shincron Co., Ltd. is used. Anti-reflection films 6, 7, which has a double film structure constituted of a $ZrO_2+TiO_2$ mixed layer and a $SiO_2$ layer, are formed on the ultraviolet ray curable resin layer 4, 5 by the RF-IP (Radio Frequency Ion Plating) method.

In a dicing step S5, a dicing device such as the one made by Disco Corp. is used to dice the transparent substrate 1 together with the anti-reflection films 6, 7 formed thereon into prescribed shapes so as to form hologram devices H.

Finally, in a hologram fixing step S6, an ultraviolet ray curable type adhesive 3033 of Three Bond Co., Ltd. is used to fix the hologram device H to the cap 13 of the laser unit U.

Figure 3:
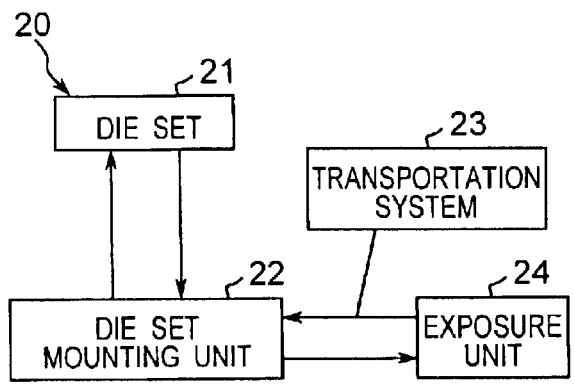
FIG. 3 is a block diagram of a 2P molding machine used in a 2P molding step shown in FIG. 2.

FIG. 3 is a block diagram of the 2P molding machine 20 used in the 2P molding step S3 shown in FIG. 2.

Figure 4:
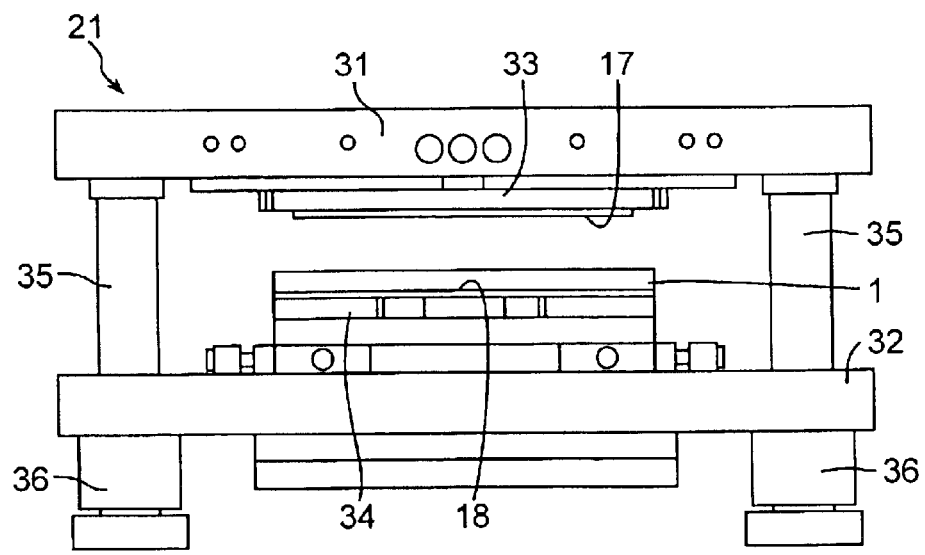
FIG. 4 is a front view of a die set shown in FIG. 3.

FIG. 4 is a front view of a die set shown in FIG. 3. As shown in FIG. 3, the 2P molding machine 20 consists of a die set 21, a die set mounting unit 22, a transportation system 23 and an exposure unit 24.

As shown in FIG. 4, guide posts 35 are vertically disposed at four corners between an upper die 31 and a lower die 32 in the die set 21. By driving a hydraulic cylinder 36 disposed on the die set mounting unit 22 side in FIG. 3, the lower die 32 is vertically moved against the upper die 31 while guided by the guide posts 35 to open or close the die. Stampers 17, 18 are fixed to the upper and lower dies 31, 32 via stamper fixed portions 33, 34, respectively. The transparent substrate 1, which is a basic part of the hologram device, is sandwiched between these stampers 17, 18 via the ultraviolet ray curable resin applied by using a dispenser or the like or dripped.

For example, a quartz substrate of $\phi$125 mm×3 mm in thickness made by Japan Sekiei Glass Co., Ltd. is used as the stamper 17, 18 so as to form a fine pattern on the surface by photolithography technique beforehand. Then, the ultraviolet ray curable resin of 0.1 g is applied in the coating time of 100 ms with a welding pressure of 3 kg/cm² by using the dispenser.

The fine pattern is formed on the transparent substrate 1 by the 2P molding method as follows.

The upper and lower dies 31, 32 of the die set 21 shown in FIG. 4 are closed, pressurized with a welding pressure of 3 kg/cm² and held for 2 minutes and 30 seconds. In this held state, the die set 21 is transported from the die set mounting unit 22 to the exposure unit 24 by the transportation system 23 (see FIG. 3). In this exposure unit 24, the ultraviolet ray curable resin is irradiated with ultraviolet rays for 20 minutes and cured to form ultraviolet ray curable resin layers 4, 5. Thus, the fine patterns of the stampers 17, 18 are precisely transferred to the ultraviolet ray curable resin layers 4, 5 on both surfaces of the transparent substrate 1. The resin thickness at this time is 5–10 μm.

Subsequently, the die set 21 is transported again to the die set mounting unit 22 by the transportation system 23. Here, the pressure is released, and the upper and lower dies 31, 32 are opened to remove the transparent substrate 1 having the ultraviolet ray curable resin layers 4, 5, in which surfaces the fine patterns are formed.

Meanwhile, a peel test was conducted in order to examine adhesion between the transparent substrate 1 and the ultraviolet ray curable resin layers 4, 5 in which surfaces the fine patterns are formed. The peel test was performed by peeling a tape adhered onto the completed substrate which was scratched in a 5 mm×5 mm lattice pattern. No peeling occurred between the transparent substrate 1 and the ultraviolet ray curable resin layers 4, 5.

Embodiments of the present invention are successively explained about a fine pattern formed on ultraviolet ray curable resin layers on both surfaces of a transparent substrate by the 2P molding step, a fine pattern formed on a stamper corresponding to the fine pattern on the resin layers, and a method for manufacturing the stamper with reference to specific experiments.

Figure 5:
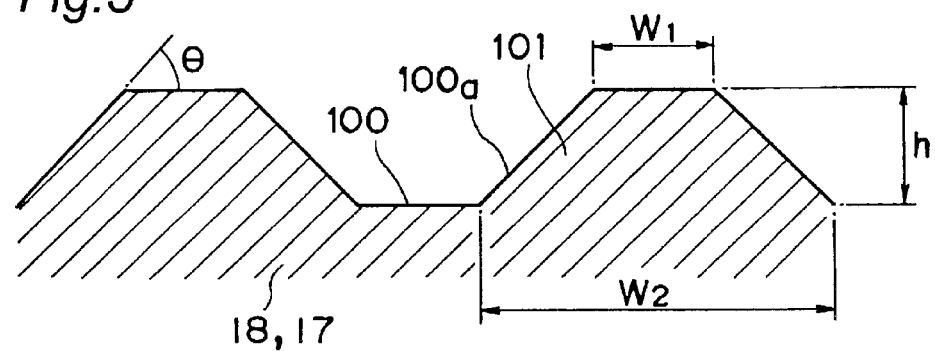
FIG. 5 is an enlarged sectional view of a fine pattern formed in a stamper according to a first embodiment of the invention.

FIG. 5 is an enlarged sectional view of a fine pattern of a stamper 17, 18 according to a first embodiment of the invention. As shown in FIG. 5, the fine pattern of the stamper 17, 18 has a groove 100 and a projected portion 101. A side wall 100a of the groove 100 is sloped at a slope angle θ against a top surface of the projected portion 101.

In the first embodiment of the invention, the slope angle θ satisfies a relationship of $\tan^{-1}(4 \times h \times w_1^{-0.2}) < \theta < 80°$ where the depth of the groove 100 is h, and the width of the top of a projected portion 101 formed by the side wall 100a of the groove 100 is $w_1$.

Figure 6:
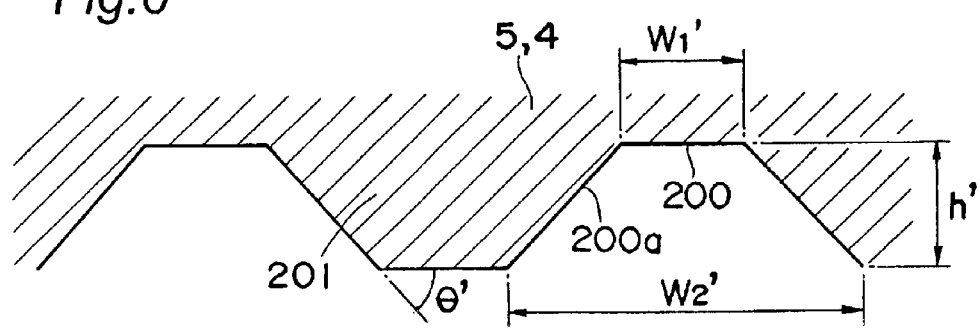
FIG. 6 is an enlarged sectional view of a fine pattern in a hologram device according to the first embodiment of the invention.

FIG. 6 is an enlarged sectional view showing a fine pattern formed on the surface of the ultraviolet ray curable resin layer 4, 5 of the hologram device H (see FIG. 1) as one embodiment of the optical device according to the first embodiment. As shown in FIG. 6, a side wall 200a of a groove 200 in this fine pattern is sloped against the device surface at a slope angle θ'. The slope angle θ' against the device surface satisfies a relationship of $\tan^{-1}(4 \times h' \times w_1'^{-0.2}) < \theta' < 80°$ where the depth of the groove 200 is h', and the bottom width of the groove 200 is $w_1'$.

The relational expression of the slope angle θ of the fine pattern in the stamper 17, 18 was obtained as follows. Fine patterns were firstly formed on the surface of the ultraviolet ray curable resin layer 4, 5 by using the stampers 17, 18 having various depths h and widths $w_1$. Secondly, for 100 fine patterns, burrs generated upon releasing from the stamper 17, 18 were observed by an optical microscope to obtain a generation percentage of the burrs. The slope angle θ was obtained by observing the cross sectional shape of the fine patterns with a Scanning Electron Microscope (SEM).

Specifically, assuming the slope angle θ of the fine pattern of the stamper 17, 18 as a parameter, the generation rate of the molding burrs was highest when θ was around 90°. The generation rate of the burr began to decrease when θ became smaller than 80°. It was dramatically reduced at 60–70°. Therefore, the upper limit for the slope angle θ of the fine pattern was decided to be 80°. As seen from $\tan^{-1}(4 \times h \times w_1^{-0.2})$, the lower limit of θ depends on h and $w_1$ of the fine pattern shape. For example, θ of about 60° is obtained when the depth h of the groove 100 is 0.4 μm and the width $w_1$ of the top of the projected portion 101 is 0.7 μm. Also, θ of about 58° is obtained when the depth h of the groove 100 is 0.4 μm and the width $w_1$ of the fine pattern is 1.0 μm. The lower limit of θ was determined by diffraction efficiency. Specifically, the lower limit of θ is a value experimentally obtained from the shape when the primary diffraction efficiency is not lower than 2%.

Therefore, the slope angle θ of the side wall 100a of the groove 100 in the fine pattern of the stamper 17, 18 is preferably in the range of 60°<θ<70°.

Furthermore, the slope angle θ' of the side wall 200a of the groove 200 in the fine pattern in the ultraviolet ray curable resin layer 4, 5 of the hologram device H is preferably in the range of 60°<θ'<70°.

Table 1 shows the width $w_1$ of the top of the projected portion 101, the width $w_2$ of the bottom of the projected portion 101, the depth h of the groove 100, the slope angle θ, the molding burr generation rate and the primary diffraction efficiency in the first embodiment as well as other embodiments described later.

TABLE 1

| | $w_1$ (μm) | $w_2$ (μm) | h (μm) | θ (°) | Molding burr's Generation rate (%) | Primary diffraction efficiency (%) |
|---|---|---|---|---|---|---|
| First Embodiment | 0.7 | — | 0.41 | 65 | 5< | 18 |
| Second Embodiment | 0.7 | 0.9 | 0.4 | 65 | 5< | 18 |
| Third Embodiment | 0.7 | — | 0.38 | 70 | ≈5 | 18 |
| Fourth Embodiment | 1.02 | — | 0.4 | 62 | 5< | 18 |
| First Comparative Example | 0.7 | — | 0.41 | 55 | 5< | 15 |
| Second Comparative Example | 0.75 | 0.7 | 0.4 | 3 | 20 | 18 |

FIG. 7 is a flow chart showing a method for manufacturing the stamper according to the first embodiment. FIGS. 8A, 8B, 8E, 8G and 8H are process drawings showing the method for manufacturing the stamper according to the first embodiment. FIGS. 8A, 8B, 8E, 8G and 8H correspond to S-a, S-b, S-e, S-g and S-h of FIG. 7, respectively.

Hereafter, the method for manufacturing the stamper 17 is explained with reference to FIGS. 7 and 8.

Figure 8A:
FIGS. 8A, 8B, 8E, 8G and 8H are process drawings showing the method for manufacturing the stamper according to the first embodiment.

In a washing step in FIG. 7 S-a and FIG. 8A, a quartz substrate 40 (φ125 mm, 3 mm in thickness) is washed by using an automatic washing device made by SPC Electronics Corp for example.

Figure 8B:
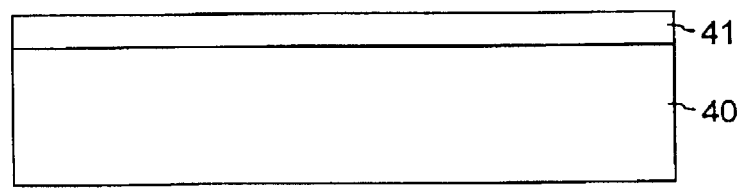
Figure 8E:
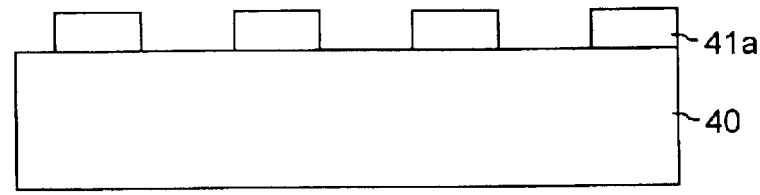
Figure 8G:
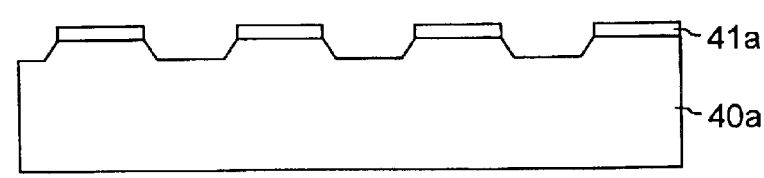
Figure 8H:
Figure 9A:
FIGS. 9A to 9F are process drawings showing manufacture of a conventional hologram device.
Figure 9B:
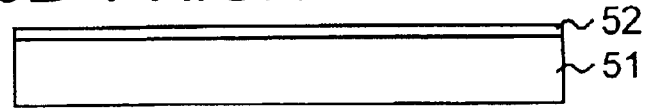
Figure 9C:
Figure 9D:
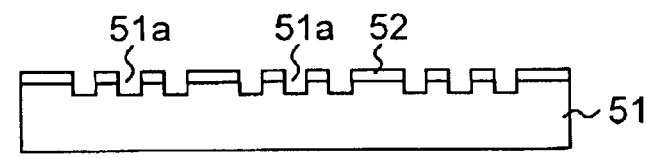
Figure 9E:
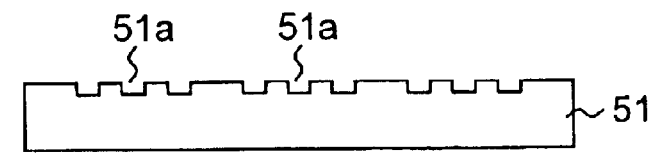
Figure 9F:
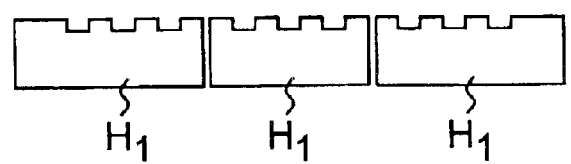
Figure 10A:
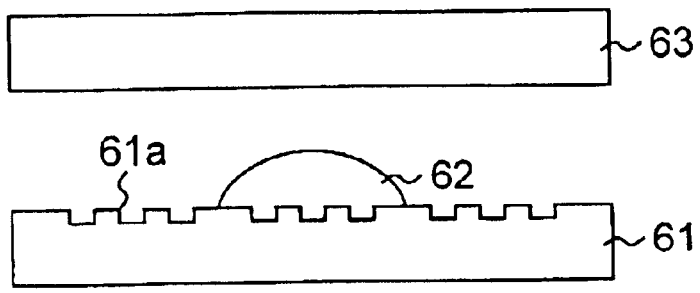
FIGS. 10A to 10C are process drawings showing manufacture of a hologram device formed by a conventional 2P molding method.
Figure 10B:
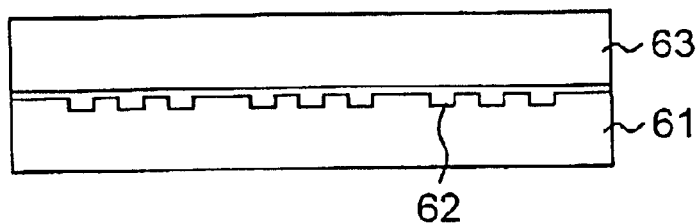
Figure 10C:
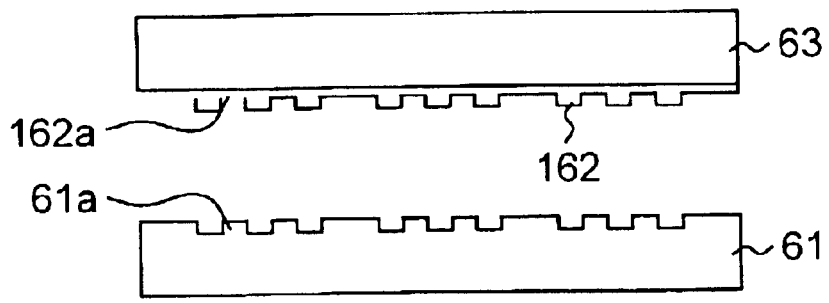
Figure 11A:
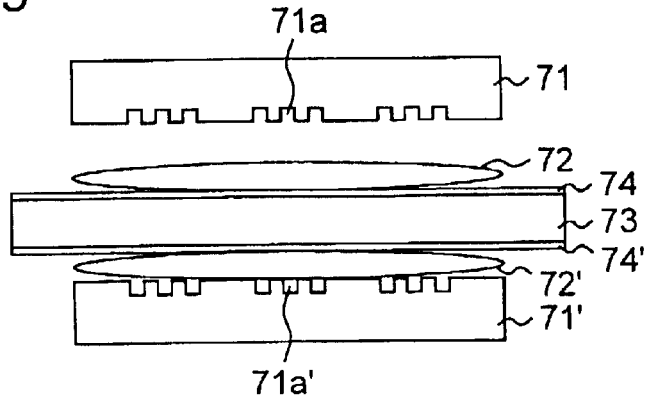
FIGS. 11A to 11D are process drawings showing manufacture of a hologram device by a conventional double-face 2P molding method.
Figure 11B:
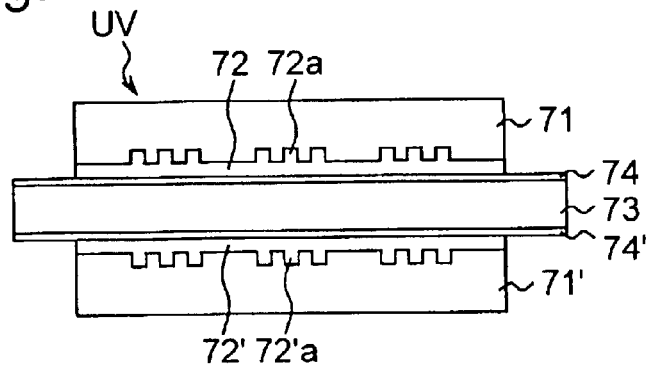
Figure 11C:
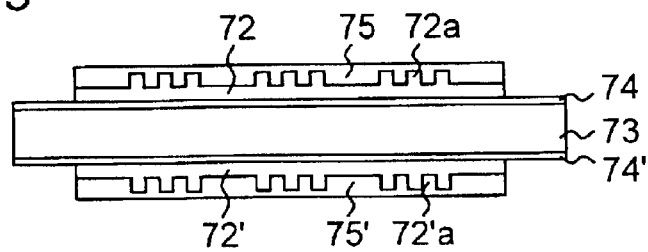
Figure 11D:
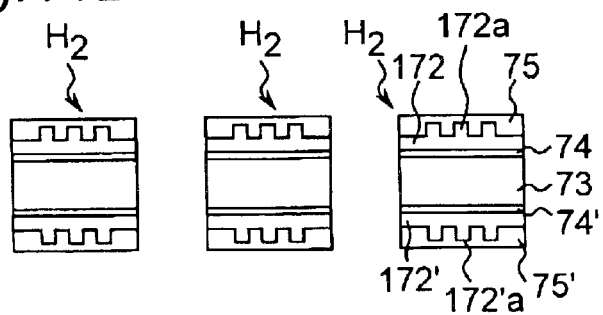
Figure 12:
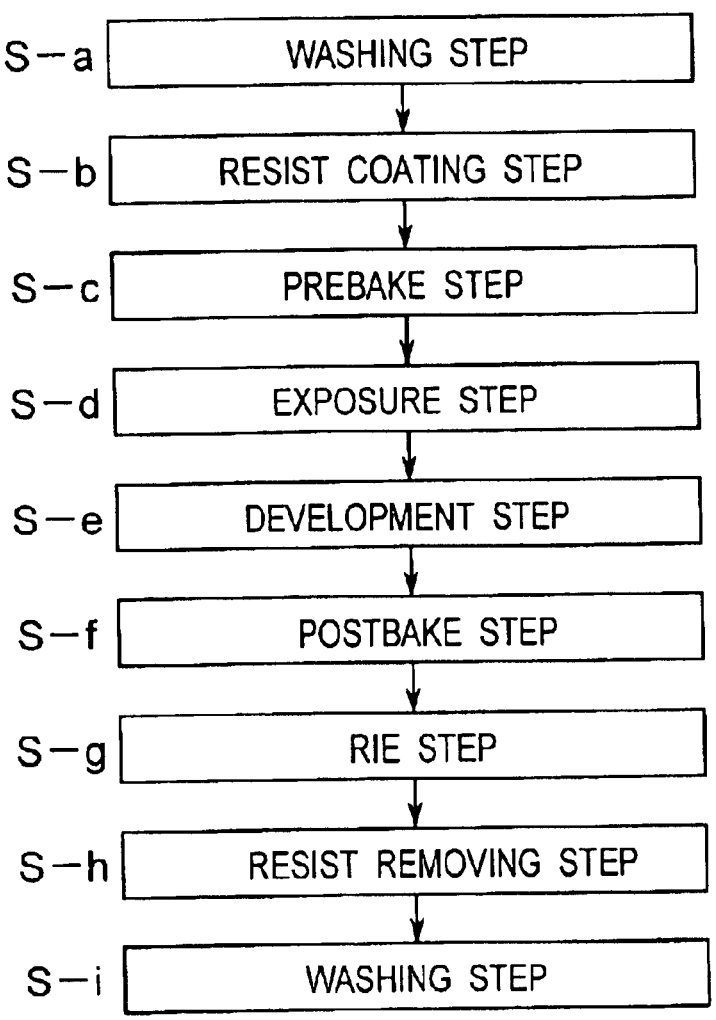
FIG. 12 is a flow chart showing manufacture of a conventional stamper.
Figure 13A:
FIGS. 13A, 13B, 13E, 13G and 13H are cross sectional views showing manufacturing processes of the conventional stamper.
Figure 13B:
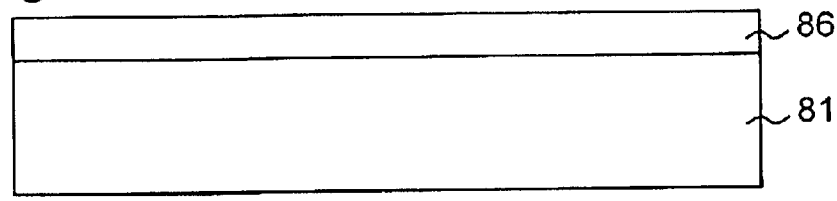
Figure 13E:
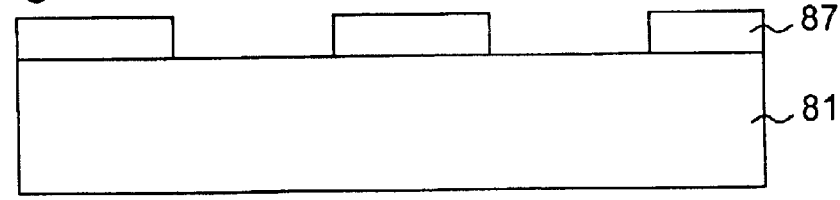
Figure 13G:
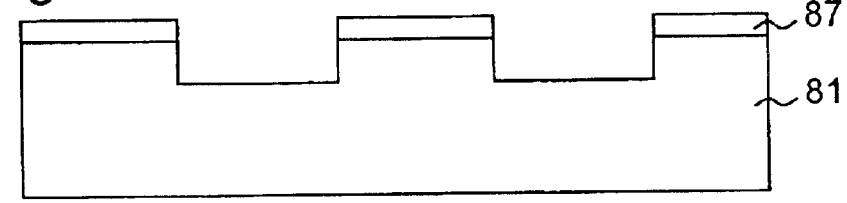
Figure 13H:
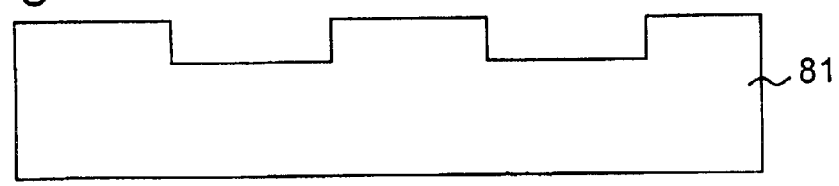
Figure 14A:
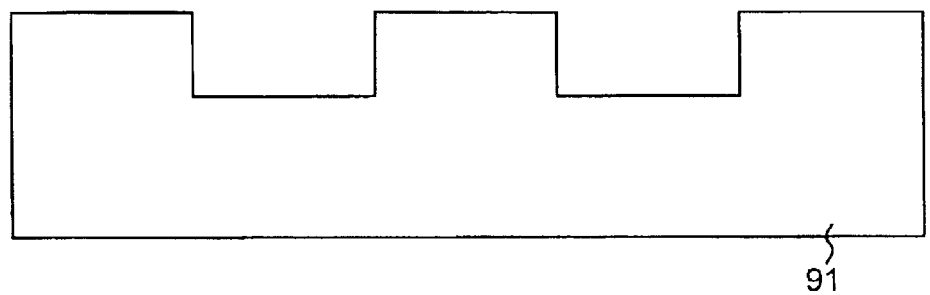
FIGS. 14A to 14C are explanatory views for explaining molding burrs generated by the conventional 2P molding method.
Figure 14B:
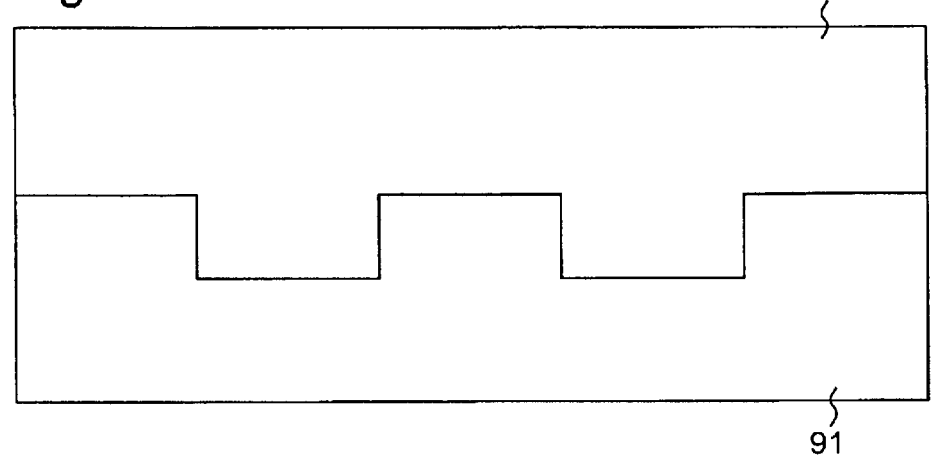
Figure 14C:
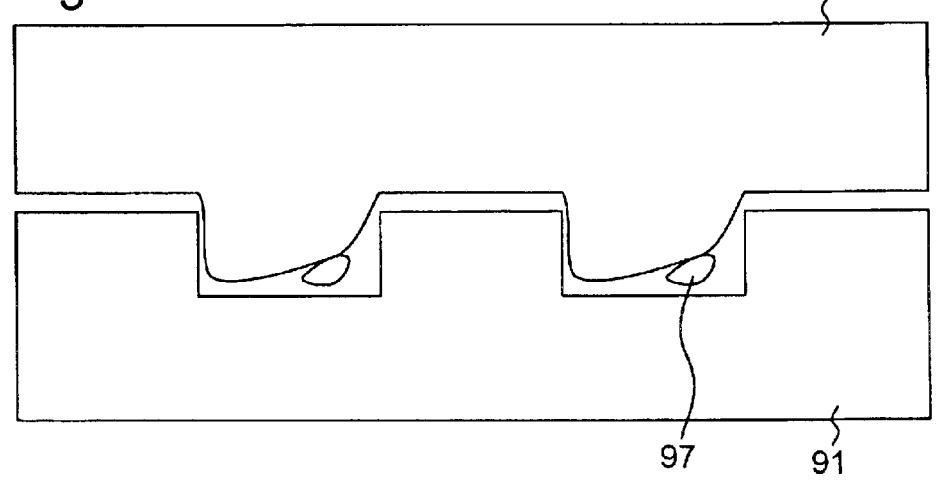

In a resist coating step in FIG. 7 S-b and FIG. 8B, the quartz substrate 40 is coated with a resist 41 (Resist S1808 of Shipley Co., Ltd.) by using a spin coater of Yuasa Co., Ltd.

In a prebaking step in FIG. 7 S-c, the substrate is prebaked in a clean oven of Daitoron Corp. at 90° C. for 50 minutes.

In an exposure step in FIG. 7 S-d, a fine pattern is exposed on the resist 41 on the quartz substrate 40 by using a mask aligner PLA-501 of Canon Inc.

In a development step in FIGS. 7 S-e and 8E, development is performed with a developer solution of Microposite 351 of Shipley Co., Ltd. diluted 5-fold by using a developer of Yuasa Co., Ltd. Consequently, a resist 41a in which a desired pattern is formed can be obtained.

In a postbake step in FIG. 7 S-f, postbake is performed at 90° C. for 50 minutes in a clean oven of Daitoron Corp.

In an RIE step in FIGS. 7 S-g and 8G, two-stage etching is performed by a 10-NR dry etching device of Samco International Inc. Specifically, in the first stage of etching, an input electric power of 85 W is used and an ultimate vacuum value is 2.7 Pa. A $CF_4$ gas of flow rate 30 sccm and an $O_2$ gas of flow rate 5 sccm are simultaneously introduced. It takes 8 minutes of time to obtain an etching depth of 180 nm. In the second stage of etching, while the vacuum state is maintained, the incident electric power is once reduced, and only $CF_4$ gas of flow rate 30 sccm is introduced. It takes 9 minutes to obtain a total depth of 400 nm with input electric power of 85 W. Thus, the fine pattern is formed on the surface of the quartz substrate 40a by the first and second stage etching.

At this time, the selection ratio of the first stage etching is lower than the selection ratio of the second stage etching. This selection ratio is defined as a ratio of an etch rate for the stamper member to an etch rate for the resist. Specifically, the selection ratio is a ratio of the etch rate for the quartz substrate 40 to the etch rate for the resist 41a.

In a resist removing step in FIGS. 7 S-h and 8H, the remaining resist is removed by $O_2$ ashing (electric power of 20 W, $O_2$ flow rate of 50 sccm, pressure of 20 Pa) with the dry etching device.

In a washing step in FIG. 7 S-i, the quartz substrate 40a is washed. This quartz substrate 40a serves as a stamper.

The fine pattern formed by RIE had a shape of h=0.41 μm, $w_1$=0.7 μm and a slope angle θ=65°. When a hologram device H was manufactured by the 2P method by using a stamper having the above fine pattern, the generation rate of molding burrs was favorably 5% or less. Furthermore, the primary diffraction efficiency was not deteriorated and favorably achieved 18%.

The fine pattern is formed by reactive ion etching, so that a stamper having consistent quality can be obtained. Furthermore, the fine pattern by reactive ion etching is formed at a low cost and excellent in mass productivity.

In the first embodiment, a $CF_4$ reactive gas and an $O_2$ gas are used in the first stage etching, but instead a $CHF_3$ reactive gas and an $O_2$ gas may be used.

Furthermore, a single $CF_4$ reactive ion gas is used in the second stage etching, but a single $CHF_3$ reactive ion gas may be used.

According to a second embodiment of the invention, the slope angle θ is controlled not by measuring the slope angle θ itself, but by measuring the width $w_1$ of the top of the projected portion and the width $w_2$ of the bottom of the projected portion. Specifically, the slope angle θ is controlled by maintaining the value of $w_2-w_1$ in the range of $0.3 \times h < (w_2-w_1) < h+0.05$.

The lower limit of $(w_2-w_1)$ corresponds to the slope angle 60°, and the upper limit of $(w_2-w_1)$ corresponds to the slope angle 80°. These limits were experimentally obtained by measuring the widths $w_1$, $w_2$ of stampers having various slope angles.

In an experimental data of a stamper according to the second embodiment, as shown in Table 1, a fine pattern in a stamper has a shape of a groove depth h=0.40 μm, the width $w_1$=0.7 μm of the top of a projected portion formed by the side wall of the groove and width $w_2$=0.9 μm of the bottom portion of the projected portion. Furthermore, the slope angle θ of the side wall of the groove in the fine pattern is 65°.

In the stamper having the slope angle θ controlled by $w_1$ and $w_2$ as described above, the generation rate of molding burrs was favorably 5% or lower, and the primary diffraction efficiency was 18% without any problems, as shown in Table 1.

It is noted that the stamper according to the second embodiment is subject to the same steps as first embodiment, that is, washing, resist coating, prebake, exposure, development and postbake. Thereafter, the same etching is conducted by using the same etching device as in first embodiment.

In a third embodiment of the invention, a method for forming a stamper has the same steps of washing, resist coating, prebake, exposure, development and postbake as in the first embodiment. However, the third embodiment is different from the first embodiment in the first etching of the RIE step, though the same etching device as in the first embodiment, that is, a 10-NR dry etching apparatus of Samco International Inc. is used to perform two-stage etching. Specifically, in the first etching, only an $O_2$ as of 50 sccm is introduced into ultimate vacuum of 20 Pa with input electric power of 50 W for 1 minute. In the first etching, a rectangular shape of a fine resist is changed to a trapezoidal shape, and edges of the projected portion in the fine shape are rounded. Then, in the second etching, only a $CF_4$ gas of 30 sccm is introduced into ultimate vacuum of 2.7 Pa with incident electric power of 85 W for 18 minutes so as to obtain the total depth of 400 nm. Thereafter, as in the case of the first embodiment, the remaining resist is ashed and washed by $O_2$.

The fine pattern formed by such RIE had a shape of h=0.38 m, w=0.70 μm and a slope angle θ=70°.

When a hologram device was manufactured by using the above stamper by the 2P method, the generation rate of molding burrs was as favorable as about 5% and the primary diffraction efficiency was 18% without any problems, as shown in Table 1.

A stamper according to a fourth embodiment of the present invention is manufactured in the same manner as in the first embodiment. This stamper had a fine pattern shape of h=0.40 μm, $w_1$=1.02 μm and a slope angle θ≈62° as shown in Table 1. Major difference between the fourth embodiment and the first embodiment is in the top width $w_1$ of the projected portion. When a hologram device H was manufactured by using the above stamper, the generation rate of molding burrs was favorably 5% or lower and the primary diffraction efficiency was favorably 18%.

A first Comparative Example in the Table 1 is based on a conventional stamper. That is, the first Comparative Example shows a molded state of an optical device molded by using a stamper formed by conventional etching. Washing, resist coating, prebake, exposure, development and postbake are the same as in the first embodiment. However, a $CF_4$ gas of 80 sccm and an $O_2$ gas of 2 sccm are introduced with input electric power 85 W, and etching is performed for 25 minutes by the etching device used in the first embodiment to obtain a depth of 400 nm. After the etching the remaining resist is removed by $O_2$ ashing (50 W, $O_2$ flow rate: 50 sccm) by the etching device. The fine pattern in the stamper formed as described above has a shape of h=0.4 µm, w=0.7 µm and a slope angle θ≈55°.

When a hologram device H was manufactured by using the stamper of the first Comparative Example, the generation rate of molding burrs was 5% or lower, but the primary diffraction efficiency was 15%, which was about 3% lower than usual. Furthermore, the primary diffraction efficiency ratio was also lower than 0.9.

As a second Comparative Example in the Table 1, steps for forming a fine pattern were the same as in the first embodiment before an etching step. However, in the etching step, only a $CF_4$ gas of 30 sccm were introduced and etching is performed with incident electric power 85W and ultimate vacuum 2.7 Pa for 24 minutes. The fine pattern in the stamper formed as described above has a shape of h=0.40 µm, w=0.75 µm and a slope angle θ≈83°.

When a hologram device H was manufactured by using the stamper of the second Comparative Example, the generation rate of molding burrs was about 20% which shows much more than that of the first embodiment.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A method for manufacturing a stamper having a fine pattern including a groove on a surface of the stamper, comprising:
    forming a resist pattern on a plate; and
    etching the plate using the resist pattern by a reactive ion etching process to form the fine pattern on the plate,
    said etching the plate comprising:
        performing a first etching by using a mixture of $CF_4$ or $CHF_3$ reactive ion gas and an oxygen gas; and
        performing a second etching by using a single $CF_4$ or $CHF_3$ reactive ion gas.

2. The method for manufacturing a stamper according to claim 1, wherein a selection ratio of the first etching is lower than a selection ratio of the second etching.

3. The method for manufacturing a stamper according to claim 1, wherein
    a side wail of the groove in the fine pattern is sloped relative to the surface of the stamper, and
    a supplementary angle θ of an angle between the sloped side wall and the surface of the stamper satisfies a relational expression:

$$\mathrm{Tan}^{-1}(4 \times h \times w_1^{-0.2}) < \theta < 80°$$

where
    h: a depth of the groove; and
    $w_1$: a width of a top of a projected portion formed by the side wall of the groove and an adjoining side wall.

4. The method for manufacturing a stamper according to claim 1, wherein
    a side wall of the groove in the fine pattern is sloped relative to the surface of the stamper, and
    a width $w_2$ of a bottom of a projected portion formed by the side wall of the groove and an adjoining side wall satisfies a relational expression:

$$0.3 \times h < (w_2 - w_1) < h + 0.05$$

where
    h: a depth of the groove, and
    $w_1$: a width of a top of the projected portion.

5. The method for manufacturing a stamper according to claim 1, wherein
    a side wail of the groove in the fine pattern is sloped relative to the surface of the stamper, and
    a supplementary angle θ of an angle between the sloped side wall and the surface of the stamper is in a range of about 60°<θ<70°.

6. A method for manufacturing a stamper having a fine pattern including a groove on a surface of the stamper, comprising:
    forming a resist pattern on a plate; and
    etching the plate using the resist pattern by a reactive ion etching process to form the fine pattern on the plate,
    said etching the plate comprising:
        performing etching of the plate by a reactive ion etching to form the fine pattern into the plate, said reactive ion etching comprising:
            performing a first etching using an oxygen gas on the resist, and
            performing a second etching using a $CF_4$ or $CHF_3$ reactive ion gas.

7. The method for manufacturing a stamper according to claim 6, wherein a selection ratio of the first etching is lower than a selection ratio of the second etching.

8. The method for manufacturing a stamper according to claim 6, wherein
    a side wall of the groove in the fine pattern is sloped relative to the surface of the stamper, and
    a supplementary angle θ of an angle between the sloped side wall and the surface of the stamper satisfies a relational expression:

$$\mathrm{Tan}^{-1}(4 \times h \times w_1^{-0.2}) < \theta < 80°$$

where
    h: a depth of the groove; and
    $w_1$: a width of a top of a projected portion formed by the side wall of the groove and an adjoining side wall.

9. The method for manufacturing a stamper according to claim 6, wherein
    a side wall of the groove in the fine pattern is sloped relative to the surface of the stamper, and
    a width $w_2$ of a bottom of a projected portion formed by the side wall of the groove and an adjoining side wall satisfies a following relational expression:

$$0.3 \times h < (w_2 - w_1) < h + 0.05$$

where
    h: a depth of the groove, and
    $w_1$: a width of a top of the projected portion.

10. The method for manufacturing a stamper according to claim 6, wherein
    a side wall of the groove in the fine pattern is sloped relative to the surface of the stamper, and
    a supplementary angle θ of an angle between the sloped side wall and the surface of the stamper is in a range of about 60°<θ<70°.

11. A method for manufacturing an optical device including a transparent substrate and an ultraviolet ray curable resin layer disposed on both surfaces of the transparent substrate via a pruner layer, comprising:

disposing the ultraviolet ray curable resin layer on the both surfaces of the transparent substrate via the primer layer; and forming a fine pattern including a groove on the ultraviolet ray curable resin layer by use of a stamper, the stamper being manufactured by a method comprising:

forming a resist pattern on a plate; and etching the plate using the resist pattern by a reactive ion etching process to form the fine pattern on the plate, said etching the plate comprising:

performing a first etching by using a mixture of $CF_4$ or $CHF_3$ reactive ion gas and an oxygen gas; and performing a second etching by using a single $CF_4$ or $CHF_3$ reactive ion gas, wherein a side wall of the groove in the fine pattern is sloped relative to the surface of the stamper, and a supplementary angle $\theta$ of an angle between the sloped side wall and the surface of the stamper satisfies a relational expression:

$$\text{Tan}^{-1}(4 \times w_1^{-0.2}) < \theta < 80°$$

where h: a depth of the groove; and $w_1$: a width of a top of a projected portion formed by the side wall of the groove and an adjoining side wall.

12. A method for manufacturing an optical device including a transparent substrate and an ultraviolet ray curable resin layer disposed on both surfaces of the transparent substrate via a primer layer, comprising:

disposing the ultraviolet ray curable resin layer on the both surfaces of the transparent substrate via the primer layer; and forming a fine pattern including a groove on the ultraviolet ray curable resin layer by use of a stamper, the stamper being manufactured by a method comprising:

forming a resist pattern on a plate; and etching the plate using the resist pattern by a reactive ion etching process to form the fine pattern on the plate, said etching the plate comprising:

performing a first etching by using a mixture of $CF_4$ or $CHF_3$ reactive ion gas and an oxygen gas; and performing a second etching by using a single $CF_4$ or $CHF_3$ reactive ion gas, wherein a side wall of the groove in the fine pattern is sloped relative to the surface of the stamper, and a width $w_2$ of a bottom of a projected portion formed by the side wail of the groove and an adjoining side wall satisfies a following relational expression:

$$0.3 \times h < (w_2 - w_1) < h + 0.05$$

where h: a depth of the groove, and $w_1$: a width of a top of the projected portion.

13. A method for manufacturing an optical device including a transparent substrate and an ultraviolet ray curable resin layer disposed on both surfaces of the transparent substrate via a primer layer, comprising:

disposing the ultraviolet ray curable resin layer on the both surfaces of the transparent substrate via the primer layer; and forming a fine pattern including a groove on the ultraviolet ray curable resin layer by use of a stamper, the stamper being manufactured by a method comprising:

forming a resist pattern on a plate; and etching the plate using the resist pattern by a reactive ion etching process to form the fine pattern on the plate, said etching the plate comprising:

performing a first etching by using mixture of a $CF_4$ or $CHF_3$ reactive ion gas and an oxygen gas; and performing a second etching by using a single $CF_4$ or $CHF_3$ reactive ion gas, wherein a side wall of the groove in the fine pattern is sloped relative to the surface of the stamper, and a supplementary angle $\theta$ of an angle between the sloped side wall and the surface of the stamper is in a range of about $60° < \theta < 70°$.

14. A method for manufacturing an optical device including a transparent substrate and an ultraviolet ray curable resin layer disposed on both surfaces of the transparent substrate via a primer layer, comprising:

disposing the ultraviolet ray curable resin layer on the both surfaces of the transparent substrate via the primer layer; and forming a fine pattern including a groove on the ultraviolet ray curable resin layer by use of a stamper, the stamper being manufactured by a method comprising:

forming a resist pattern on a plate; and etching the plate using the resist pattern by a reactive ion etching process to form the fine pattern on the plate, said etching the plate comprising:

performing a first etching using an oxygen gas on the resist, and performing a second etching using a $CF_4$ or $CHF_3$ reactive ion gas, where a side wall of the groove in the fine pattern is sloped relative to the surface of the stamper, and a supplementary angle $\theta$ of an angle between the sloped side wall and the surface of the stamper satisfies a following relational expression:

$$\text{Tan}^{-1}(4 \times h \times w_1^{-0.2}) < \theta < 80°$$

where h: a depth of the groove; and $w_1$: a width of a top of a projected portion formed by the side wall of the groove and an adjoining side wall.

15. A method for manufacturing an optical device including a transparent substrate and an ultraviolet ray curable resin layer disposed on both surfaces of the transparent substrate via a primer layer, comprising:

disposing the ultraviolet ray curable resin layer on the both surfaces of the transparent substrate via the primer layer; and forming a fine pattern including a groove on the ultraviolet ray curable resin layer by use of a stamper, the stamper being manufactured by a method comprising:

forming a resist pattern on a plate; and etching the plate using the resist pattern by a reactive ion etching process to form the fine pattern on the plate, said etching the plate comprising:

performing a first etching using an oxygen gas on the resist, and performing a second etching using a $CF_4$ or $CHF_3$ reactive ion gas, where a side wall of the groove in the fine pattern is sloped relative to the surface of the stamper, and a width $w_2$ of a bottom of a projected portion formed by the side wall of the groove and an adjoining side wall satisfies a following relational expression:

$$0.3 \times h < (w_2 - w_1) < h + 0.05$$

where h: a depth of the groove, and $w_1$: a width of a top of the projected portion.

16. A method for manufacturing an optical device including a transparent substrate and an ultraviolet ray curable resin layer disposed on both surfaces of the transparent substrate via a primer layer, comprising:

disposing the ultraviolet ray curable resin layer on the both surfaces of the transparent substrate via the primer layer; and forming a fine pattern including a groove on the ultraviolet ray curable resin layer by use of a stamper, the stamper being manufactured by a method comprising:

forming a resist pattern on a plate; and etching the plate using the resist pattern by a reactive ion etching process to form the fine pattern on the plate, said etching the plate comprising:

performing a first etching using an oxygen gas on the resist, and performing a second etching using a $CF_4$ or $CHF_3$ reactive ion gas, where a side wall of the groove in the fine pattern is sloped relative to the surface of the stamper, and a supplementary angle θ of an angle between the sloped side wall and the surface of the stamper is in a range of about 60°<θ<70°.

* * * * *